(12) United States Patent
Fang et al.

(10) Patent No.: US 11,658,268 B2
(45) Date of Patent: May 23, 2023

(54) LIGHT-EMITTING SEMICONDUCTOR STRUCTURE AND LIGHT-EMITTING SEMICONDUCTOR SUBSTRATE

(71) Applicant: PlayNitride Display Co., Ltd., Miaoli County (TW)

(72) Inventors: Hsin-Chiao Fang, Miaoli County (TW); Yen-Lin Lai, Miaoli County (TW); Jyun-De Wu, Miaoli County (TW)

(73) Assignee: PlayNitride Display Co., Ltd., Miaoli County (TW)

(*) Notice: Subject to any disclaimer, the term of this patent is extended or adjusted under 35 U.S.C. 154(b) by 250 days.

(21) Appl. No.: 17/093,590

(22) Filed: Nov. 9, 2020

(65) Prior Publication Data
US 2021/0399174 A1    Dec. 23, 2021

(30) Foreign Application Priority Data
Jun. 19, 2020 (TW) ................... 109120894

(51) Int. Cl.
*H01L 33/26* (2010.01)
*H01L 33/22* (2010.01)

(52) U.S. Cl.
CPC ............ *H01L 33/26* (2013.01); *H01L 33/22* (2013.01)

(58) Field of Classification Search
CPC .................................. H01L 33/22; H01L 33/26
See application file for complete search history.

(56) References Cited

U.S. PATENT DOCUMENTS

| | | | | |
|---|---|---|---|---|
| 8,729,588 | B2* | 5/2014 | Chen | H01L 33/22 |
| | | | | 257/E33.074 |
| 9,287,451 | B2* | 3/2016 | Chiu | H01L 33/007 |
| 2009/0008652 | A1* | 1/2009 | Ueda | H01L 21/02573 |
| | | | | 257/E21.127 |
| 2009/0117675 | A1* | 5/2009 | Yamanaka | H01L 21/02664 |
| | | | | 438/22 |
| 2013/0005060 | A1* | 1/2013 | Lo | C23C 18/1245 |
| | | | | 438/694 |

FOREIGN PATENT DOCUMENTS

| | | |
|---|---|---|
| CN | 101061571 A | 10/2007 |
| CN | 101635324 A | 1/2010 |
| CN | 101897006 A | 11/2010 |
| CN | 102473742 A | 5/2012 |
| CN | 103078051 A | 5/2013 |
| CN | 103383981 A | 11/2013 |
| CN | 104733408 A | 6/2015 |
| CN | 105742440 A | 7/2016 |
| CN | 108028183 A | 5/2018 |
| CN | 109790642 A | 5/2019 |
| CN | 110544618 A | 12/2019 |
| JP | 2006352079 A | 12/2006 |
| JP | 4882351 B2 | 2/2012 |
| TW | 201603329 A | 1/2016 |

\* cited by examiner

*Primary Examiner* — Mark W Tornow
(74) *Attorney, Agent, or Firm* — CKC & Partners Co., LLC

(57) ABSTRACT

A light-emitting semiconductor substrate, which is applied to a light-emitting semiconductor structure, includes a base and a plurality of particle groups. The base includes an upper surface. The particle groups are on the upper surface or inside the base dispersedly, and each of the particle groups includes Sn, Sn compounds or combinations thereof.

9 Claims, 5 Drawing Sheets

30

50

LIGHT-EMITTING SEMICONDUCTOR STRUCTURE AND LIGHT-EMITTING SEMICONDUCTOR SUBSTRATE

RELATED APPLICATIONS

This application claims priority to Taiwan Application Serial Number 109120894, filed Jun. 19, 2020, which is herein incorporated by reference.

BACKGROUND

Technical Field

The present disclosure relates to a light-emitting structure and a substrate. More particularly, the present disclosure relates to a light-emitting semiconductor structure and a light-emitting semiconductor substrate.

Description of Related Art

Owing to the development of the optoelectronic technology, the sizes of optoelectronic elements are reduced. Recently, applications of the micro-LED with the size smaller than 100 μm have received great attention because of a great improvement of the manufacturing of light-emitting diodes (LEDs). However, during the growth of the micro-LED, high lattice defects or a high dislocation density are easily generated as a result of the lattice matching problems between the sapphire substrate and GaN; consequently, the epitaxy quality thereof is lowered and the light-emitting efficiency thereof is decreased. In addition, the anti-ESD capability thereof is poor.

The light-emitting efficiency affected by the lattice matching problems will become more serious for the micro-LED in micro scale; hence, how to improve the light-emitting semiconductor structure such as the micro-LED, and the substrate thereof to increase the anti-ESD capability becomes a pursuit target for practitioners.

SUMMARY

According to one aspect of the present disclosure, a light-emitting semiconductor substrate applied to a light-emitting semiconductor structure is provided. The light-emitting semiconductor substrate includes a base and a plurality of particle groups. The base includes an upper surface. The particle groups are located on the upper surface or inside the base dispersedly, and each of the particle groups includes Sn, Sn compounds or combinations thereof.

According to another aspect of the present disclosure, a light-emitting semiconductor structure including a light-emitting semiconductor substrate and an epitaxy structure is provided. The light-emitting semiconductor substrate includes a base and a plurality of particle groups. The base includes an upper surface. The particle groups are located on the upper surface or inside the base dispersedly, and each of the particle groups includes Sn, Sn compounds or combinations thereof. The epitaxy structure is located on the light-emitting semiconductor substrate, and a thickness of the epitaxy structure is smaller than or equal to 10 μm.

BRIEF DESCRIPTION OF THE DRAWINGS

The disclosure can be more fully understood by reading the following detailed description of the embodiments, with reference made to the accompanying drawings as follows.

DETAILED DESCRIPTION

It will be understood that when an element (or mechanism or module) is referred to as being "disposed on", "connected to" or "coupled to" another element, it can be directly disposed on, connected or coupled to the other elements, or it can be indirectly disposed on, connected or coupled to the other elements, that is, intervening elements may be present. In contrast, when an element is referred to as being "directly disposed on", "directly connected to" or "directly coupled to" another element, there is no intervening element present.

In addition, the terms first, second, third, etc. are used herein to describe various elements or components, these elements or components should not be limited by these terms. Consequently, a first element or component discussed below could be termed a second element or component.

Figure 1:
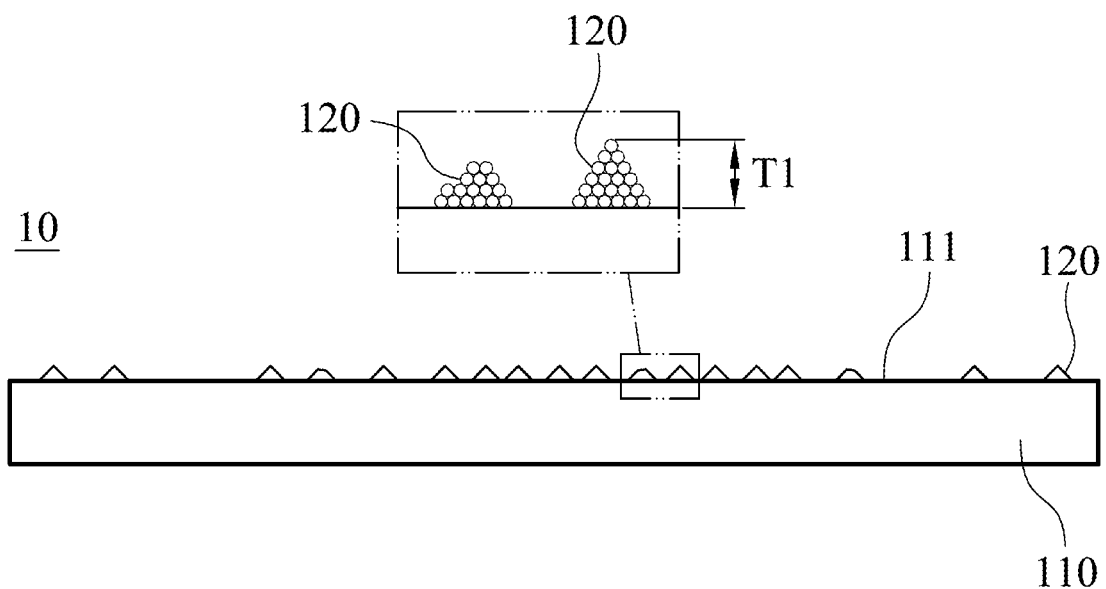
FIG. 1 shows a side view of a light-emitting semiconductor substrate according to a first embodiment of the present disclosure.
Figure 2:
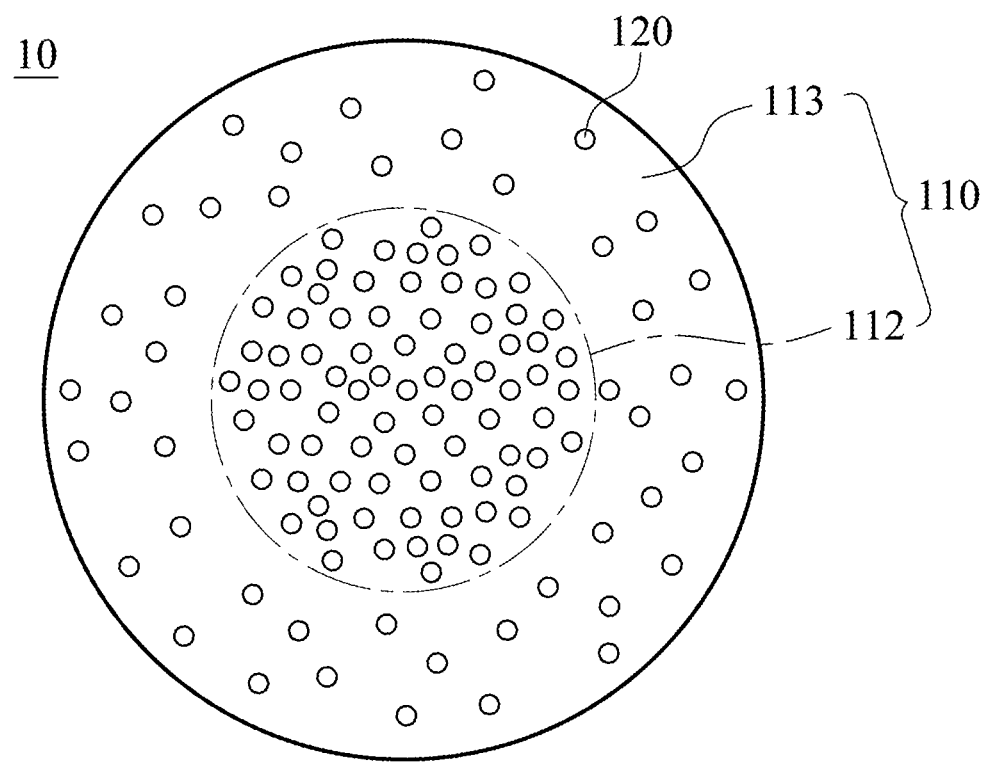
FIG. 2 shows a top view of the light-emitting semiconductor substrate of the first embodiment of FIG. 1.
Figure 7:
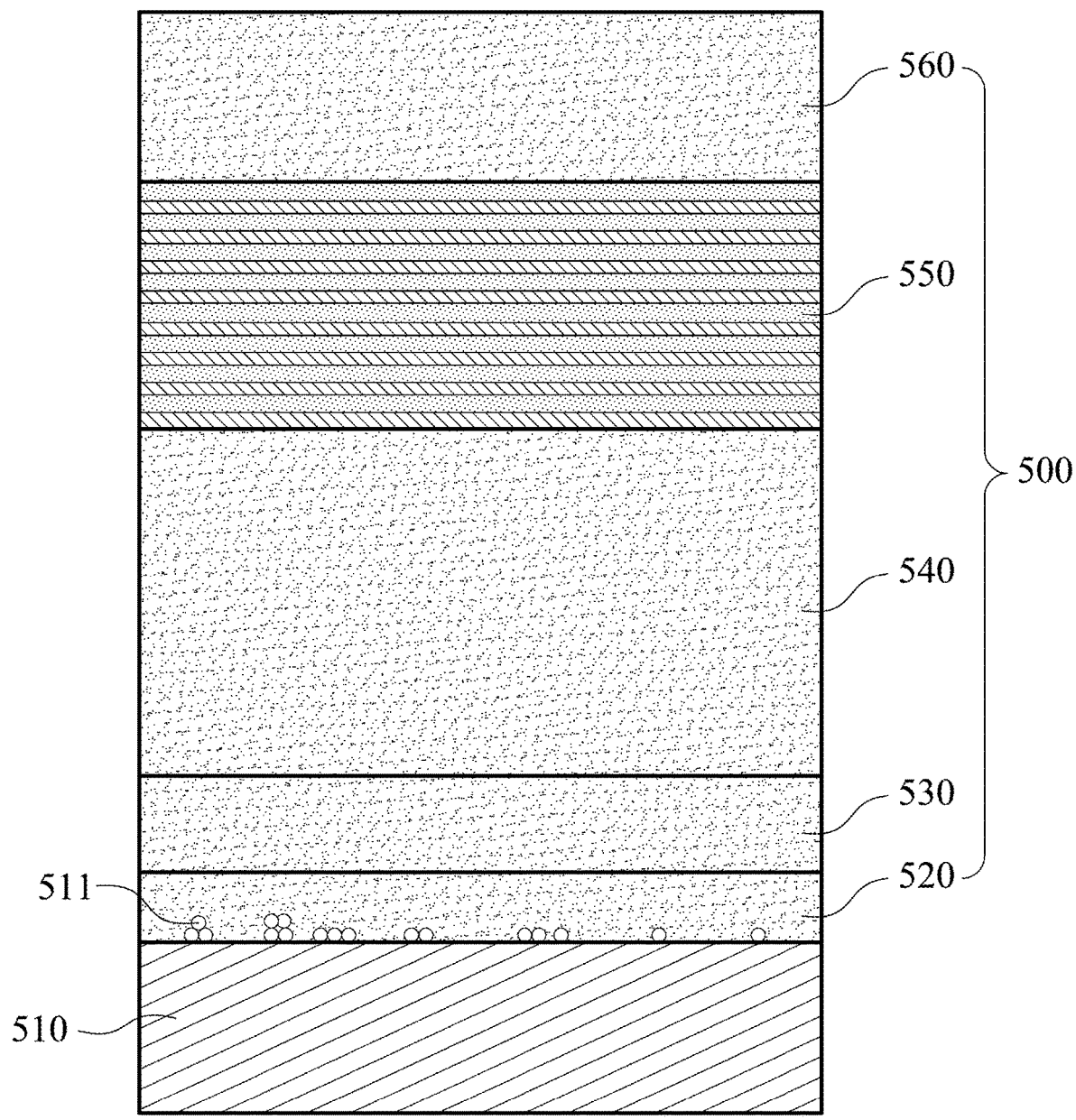
FIG. 7 shows a cross-sectional view of a light-emitting semiconductor structure according to a fifth embodiment of the present disclosure.

FIG. 1 shows a side view of a light-emitting semiconductor substrate 10 according to a first embodiment of the present disclosure. FIG. 2 shows a top view of the light-emitting semiconductor substrate 10 of the first embodiment of FIG. 1. The light-emitting semiconductor substrate 10 is applied to a light-emitting semiconductor structure which is not shown in FIGS. 1 and 2 and is shown in FIG. 7. The light-emitting semiconductor substrate 10 includes a base 110 and a plurality of particle groups 120. The base 110 includes an upper surface 111. The particle groups 120 are located on the upper surface 111 dispersedly, and each of the particle groups 120 includes Sn, Sn compounds or combinations thereof.

Therefore, through the discontinuous distribution of the particle groups 120, the lateral growth of the epitaxy structure grown thereon in the following process can be increased to improve the quality thereof, thereby increasing the anti-ESD capability. The details of the light-emitting semiconductor substrate 10 will be described hereafter.

The light-emitting semiconductor substrate 10 can be made of silicon carbide (SiC), aluminum nitride (AlN), a glass or a sapphire; hence, the base 110 can be a SiC base, a AlN base, a glass base or a sapphire base. The upper surface 111 is a surface configured for the epitaxy structure to grow thereon. The particle groups 120 may be a discontinuous film formed by a PVD method or a CVD method, and through the temperature control or the pressure control, the independent and dispersive particle groups 120 can be formed. Each of the particle groups 120 is a three-dimensional geometric structure protruding from the upper surface 111, and the three-dimensional geometric structures are stripe-shaped structures, island-shaped structures, curve-shaped structures, cone-shaped structures or combinations thereof, which can be favorable for growing the epitaxy structure thereon in the following process. However, the aforementioned fabricating processes are for illustration only, and any possible fabricating process can be used in the present disclosure for forming the randomly dispersed particle groups 120 or clusters on the upper surface 111. Please be noted that, the three-dimensional geometric structures of the particle groups 120 can be asymmetrical and can be made of Sn or Sn compounds such as $SnO_2$. The particle groups 120 can be made of a combination of Sn and Sn compounds to disperse the random stress of the epitaxy grown thereon in the following process.

Moreover, the discontinuous film and the upper surface 111 satisfy A1≤0.01×A2, wherein A1 represents an area of the discontinuous film, and A2 represents an area of the upper surface 111. The area of the discontinuous film indicates the total area of the particle groups 120, and more precisely, the area of the discontinuous film indicates a sum of the bottom surfaces of the particle groups 120 contacted with the upper surface 111. The sum is limited to be below 1% of the area of the upper surface 111 to avoid the growth of the epitaxy structure grown thereon in the following process from affecting by the lattice mismatch. Because the base 110 of the light-emitting semiconductor substrate 10 includes Sn, Sn compounds or combinations thereof, e.g., the particle groups 120 made of $SnO_2$ dispersedly on the upper surface 111, the lattice mismatch between the light-emitting semiconductor substrate 10 and the epitaxy structure grown thereon in the following process can be decreased to lower the stress. The configuration is more suitable for the sapphire base which has huge lattice mismatch with the nitride epitaxy structure, thereby efficiently decreasing the dislocation between the epitaxy structure and the light-emitting semiconductor substrate 10 caused by stress.

The base 110 can further include a central region 112 and an outer region 113 surrounding the central region 112, and the particle groups 120 and the base 110 satisfy D4<D3, wherein D3 represents a density of the particle groups 120 on the central region 112, and D4 represents a density of the particle groups 120 on the outer region 113. From the top view, the central region 112 indicates the region adjacent to a center of the base 110, and the outer region 113 indicates the region which surrounds the central region 112 and is adjacent to a periphery of the base 110. The central region 112 and the outer region 113 are integrally connected and no boundary is included therebetween. Please be noted that, the division is only for clearly specifying the two regions, and the present disclosure is not limited thereto. Based on the relationship of D4<D3, a number of the particle groups 120 of the central region 112 per unit area is more than a number of the particle groups 120 of the outer region 113 per unit area. When D4<D3 is satisfied, the defects generated during growing the epitaxy structure on the central region 112 can be reduced. Furthermore, as long as the area of the outer region 113 is smaller than or equal to 10% of the area of the base 110, the quality of the epitaxy structure will be better.

Additionally, as shown in FIG. 1, each of the particle groups 120 can have a thickness T1, each thickness T1 is smaller than or equal to 50 nm, wherein T1 represents a maximum perpendicular distance between a top surface or a top point of the particle group 120 and the upper surface 111. Therefore, a number of the defects of the upper surface 111, which would affect the following growth of the epitaxy in the following process, can be avoided.

Figure 3:
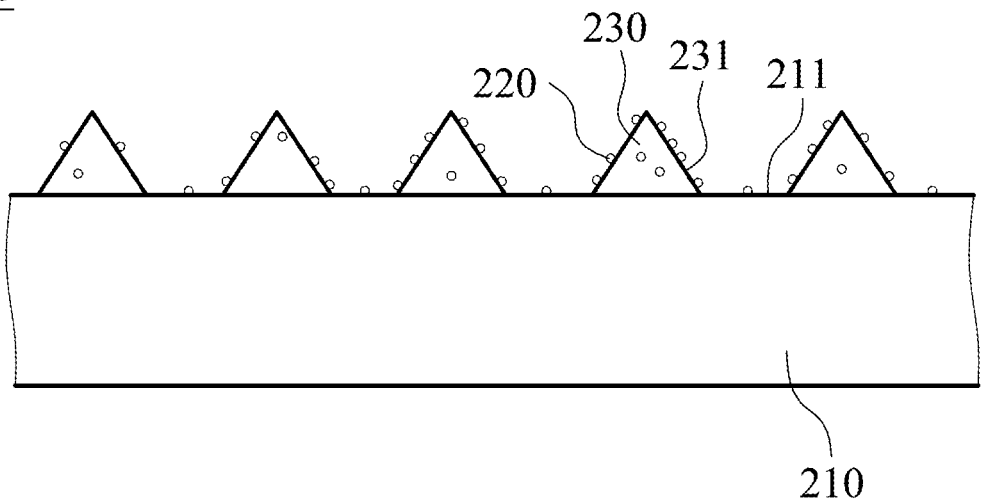
FIG. 3 shows a side view of a light-emitting semiconductor substrate according to a second embodiment of the present disclosure.
Figure 4:
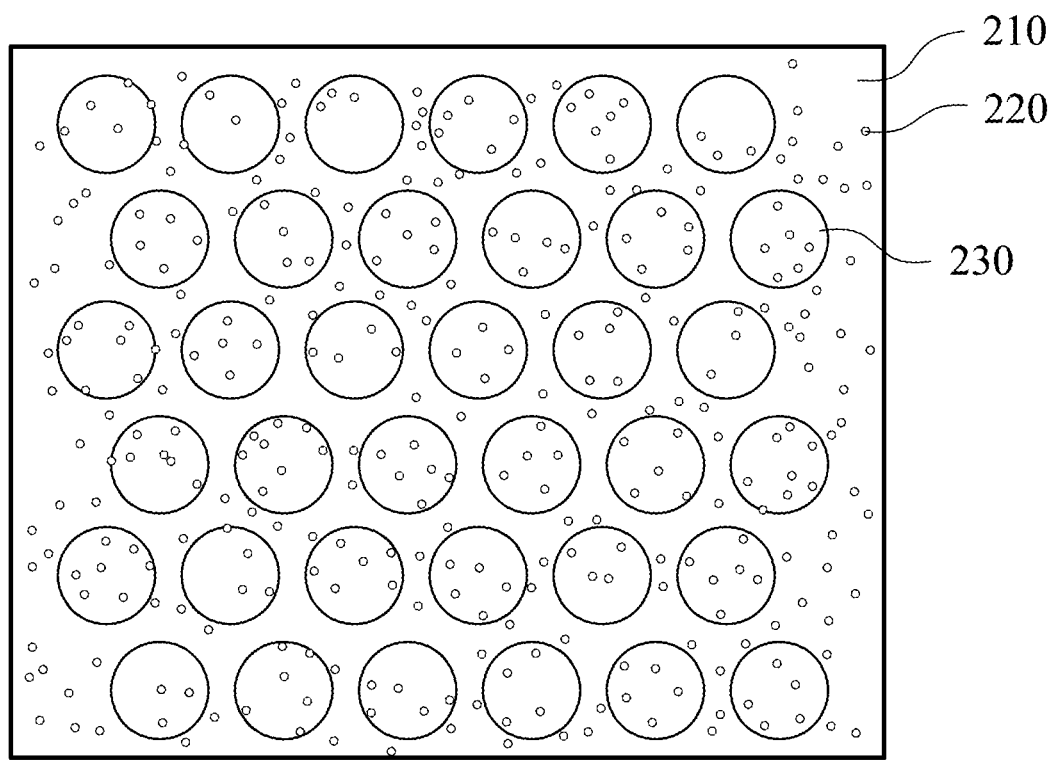
FIG. 4 shows a top view of the light-emitting semiconductor substrate of the second embodiment of FIG. 3.

FIG. 3 shows a side view of a light-emitting semiconductor substrate 20 according to a second embodiment of the present disclosure. FIG. 4 shows a top view of the light-emitting semiconductor substrate 20 of the second embodiment of FIG. 3. The second embodiment is similar to the first embodiment, but the configurations of the protrusions 230 and the particle groups 220 of the second embodiment are different from the first embodiment. The light-emitting semiconductor substrate 20 of the second embodiment can further include a plurality of protrusions 230 integrally formed with the base 210. The protrusions 230 are spaced apart from each other on the upper surface 211, and each of the protrusions 230 includes at least one inclined surface 231. In the second embodiment, the particle groups 220 are located on the upper surface 211 and the at least one inclined surface 231 of each of the protrusions 230 dispersedly, and satisfy a relationship of D2<D1, wherein D1 represents a density of the particle groups 220 on the at least one inclined surface 231 of each of the protrusions 230, and D2 represents a density of the particle groups 220 on the upper surface 211. The particle groups 220 are located on the upper surface 211 and the at least one inclined surface 231 of each of the protrusions 230 to form a discontinuous film, and the discontinuous film, the upper surface 211 and the inclined surfaces 231 of the protrusions 230 satisfy A1≤0.01×A2', wherein A1 represents an area of the discontinuous film, and A2' represents a sum of an area of the upper surface 211 and areas of the inclined surfaces 231 of the protrusions 230.

Precisely, the base 210 is processed by coating, exposure and etching to cut unrequired parts based on a predetermined pattern so as to allow the protrusions 230 to integrally form thereon, and the protrusions 230 are the parts which stick out of the upper surface 211 of the base 210. In other words, the at least one inclined surface 231 of each of the protrusions 230 and the upper surface 211 are continuous, and the at least one inclined surface 231 of each of the protrusions 230 can be deemed as a part of the upper surface 211 of the base 210. The process is well known and is not the key feature of the present disclosure; hence, the details thereof will not be mentioned.

It can be understood from the second embodiment that each of the protrusions 230 is cone-shaped and has one inclined surface 231. However, in other embodiments, the protrusion can be, but not limited to, a pyramidal tetrahedron having four inclined surfaces or an island-shaped polyhedron having a plurality of inclined surfaces. Based on the relationship of D2<D1, a number of the particle groups 220 on the inclined surface 231 per unit area is more than a number of the particle groups 220 on the upper surface 211, especially indicating the area of the upper surface 211 not covered by the protrusions 230, per unit area. Because the stress which leads cracks on the epitaxy structure will extend along the inclined surfaces 231 of the protrusions 230, that the density of the particle groups 220 on the inclined surfaces 231 is larger than the density of the particle groups 220 on the upper surface 211 not covered by the protrusions 230 can facilitate lateral growth of the epitaxy structure grown thereon in the following process.

Figure 5:
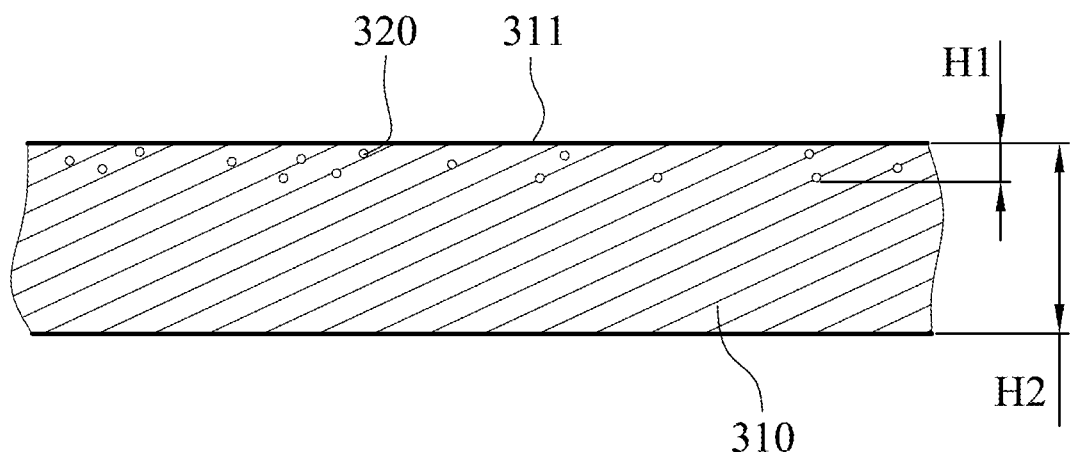
FIG. 5 shows a cross-sectional view of a light-emitting semiconductor substrate according to a third embodiment of the present disclosure.

FIG. 5 shows a cross-sectional view of a light-emitting semiconductor substrate 30 according to a third embodiment of the present disclosure. The third embodiment is similar to the first embodiment, but the configurations of the particle groups 320 of the third embodiment are different from the first embodiment. In the third embodiment, the particle groups 320 are doped in the base 310 dispersedly to form a discontinuous distribution. In other words, the particle groups 320 are randomly and dispersedly located under the upper surface 311. The particle groups 320 can be, for example, implanted into the base 310 by an ion implantation method, and through controlling of the ion current density, implantation time and ion energy, the concentration or depth of the implants can be controlled. The ion implantation method is not a key feature of the present disclosure, and the details will not be mentioned. A ratio of the particle groups 320 to the base 310 can be smaller than or equal to 0.01 to prevent defects generated in the epitaxy growth in the following process. The ratio can be, for example, an atomic ratio.

In the third embodiment, the particle groups 320 and the upper surface 311 satisfy A3≤0.01×A2, wherein A3 represents an area of the discontinuous distribution, and A2 represents an area of the upper surface 311. In addition, the particle groups 320 and the base 310 can satisfy H1≤0.1×H2, wherein H1 represents a perpendicular distance between each of the particle groups 320 and the upper surface 311, and H2 represents a height of the base 310. The relationship of H1/H2≤0.1 facilitates the lateral growth of the epitaxy structure grown thereon in the following process. In the third embodiment, the perpendicular distance H1 can be smaller than or equal to 100 nm, but the present disclosure is not limited thereto.

Figure 6:
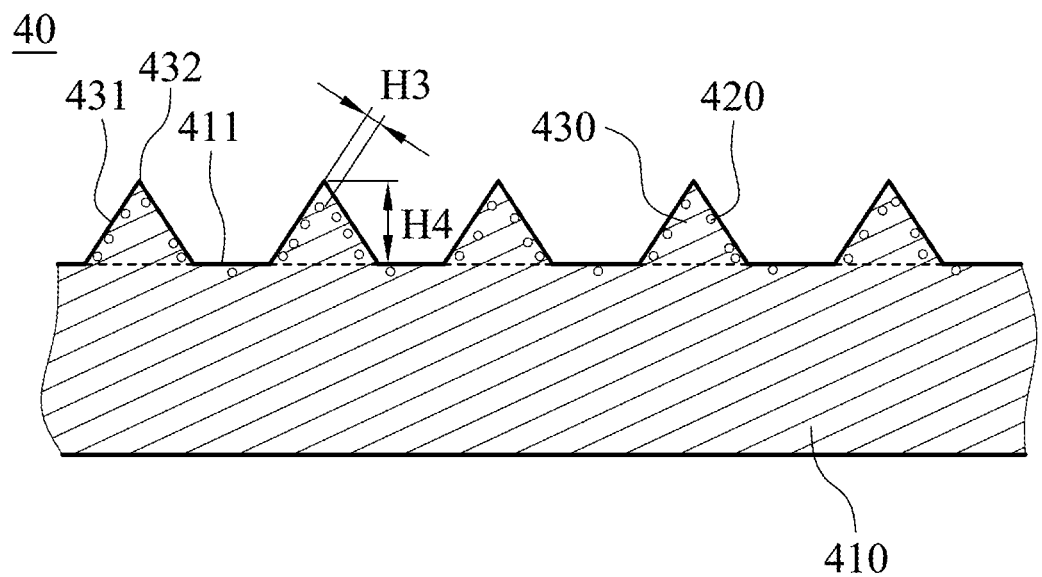
FIG. 6 shows a cross-sectional view of a light-emitting semiconductor substrate according to a fourth embodiment of the present disclosure.

FIG. 6 shows a cross-sectional view of a light-emitting semiconductor substrate 40 according to a fourth embodiment of the present disclosure. In the fourth embodiment, the light-emitting semiconductor substrate 40 can include a base 410, a plurality of particle groups 420 and a plurality of protrusions 430. The relation and fabricating method of the base 410 and the protrusions 430 are identical to the base 210 and the protrusions 230 in the second embodiment, and the details will not be mentioned.

In the fourth embodiment, the particle groups 420 are doped in the base 410 and each of the protrusions 430 dispersedly to form a discontinuous distribution. In other words, the particle groups 420 are randomly and dispersedly located in the base 410 and under the inclined surface 431 of the protrusions 430. The particle groups 420 can be, for example, implanted into the base 410 by an ion implantation method, and through controlling of the ion current density, implantation time and ion energy, the concentration or depth of the implants can be controlled. The ion implantation method is not a key feature of the present disclosure, and the details will not be mentioned.

Each of the protrusions 430 can include the inclined surface 431 and a top point 432, and the particle groups 420 and the base 410 satisfy H3≤0.1×H4, wherein H3 represents a perpendicular distance between each of the particle groups 420 and the inclined surface 431 of each of the protrusions 430, and H4 represents a height between the top point 432 of each of the protrusions 430 and the upper surface 411. The relationship of H3/H4≤0.1 facilitates the lateral growth of the epitaxy structure grown thereon in the following process. In the fourth embodiment, each height of each protrusion 430, i.e., H4, is in a range from 1 μm to 2 μm, but the present disclosure will not be limited thereto. Moreover, the particle groups 420 are located under the upper surface 411 and the inclined surface 431 of each of the protrusions 430 to form the discontinuous distribution and satisfy A3≤0.01×A2', wherein A3 represents an area of the discontinuous distribution, and A2' represents a sum of an area of the upper surface 411 and areas of the inclined surfaces 431 of the protrusions 430.

FIG. 7 shows a cross-sectional view of a light-emitting semiconductor structure 50 according to a fifth embodiment of the present disclosure. The light-emitting semiconductor structure 50 includes a light-emitting semiconductor substrate (not labeled) and an epitaxy structure 500. The light-emitting semiconductor substrate can be identical to any one of the light-emitting semiconductor substrates 10, 20, 30 and 40 and include a base 510 and a plurality of particle groups 511. A thickness of the epitaxy structure 500 is smaller than or equal to 10 μm, which can be processed to be divided into a plurality of micro-LEDs (not shown). The epitaxy structure 500 can include a nuclear layer 520 located on the light-emitting semiconductor substrate, a buffer layer 530 located on the nuclear layer 520, a first-type semiconductor layer 540 located on the buffer layer 530, an active layer 550 located on the first type semiconductor layer 540, and a second-type semiconductor layer 560 located on the active layer 550.

The nuclear layer 520 can be made of aluminum compounds, such as AlN. The buffer layer 530 can be made of GaN, such as undoped GaN. The first-type semiconductor layer 540 may be N-type nitride semiconductor stack layers made by adding N-type dopants to GaN, AlGaN, AlInGaN or InGaN. The active layer 550 can be made of quantum wells, such as multiple quantum wells. The second-type semiconductor layer 560 may be P-type nitride semiconductor stack layers made by adding P-type dopants to GaN, AlGaN, AlInGaN or InGaN. The present disclosure is not limited thereto.

Table 1 shows testing results of electrical characteristics of the light-emitting semiconductor structure 50 of the fifth embodiment and a light-emitting semiconductor structure (not shown) of a comparison example. Vr represents the inverse voltage. Ir represents the inverse current. ESD represents the electrostatic discharge. The particle groups 511 of the light-emitting semiconductor structure 50 consist of Sn, and the light-emitting semiconductor structure of the comparison example does not include any particle groups. It can be known from Table 1, the anti-ESD capability of the light-emitting semiconductor structure 50 of the fifth embodiment of the present disclosure is better.

TABLE 1

|  | Vr (V) | Ir (μA) | ESD (%) |
|---|---|---|---|
| the fifth embodiment | 28.12 | 0.13 | 62.9 |
| the comparison example | 25.07 | 0.21 | 5.2 |

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A light-emitting semiconductor substrate, which is applied to a light-emitting semiconductor structure, comprising:
    a base comprising an upper surface;
    a plurality of protrusions integrally formed with the base, the protrusions spaced apart from each other on the upper surface, each of the protrusions comprising at least one inclined surface; and a plurality of particle groups embodied inside both the base and each of the protrusions dispersedly to be a discontinuous distribution, each of the particle groups comprising Sn, Sn compounds or combinations thereof.

2. The light-emitting semiconductor substrate of claim 1, wherein the discontinuous distribution and the upper surface satisfy A3≤0.01×A2, wherein A3 represents an area of the discontinuous distribution, and A2 represents an area of the upper surface.

3. The light-emitting semiconductor substrate of claim 2, wherein an atomic ratio of the particle groups to the base is smaller than or equal to 0.01.

4. The light-emitting semiconductor substrate of claim 2, wherein the particle groups and the base satisfy H1≤0.1×H2, wherein H1 represents a distance perpendicular to the upper surface of the base between each of the particle groups and the upper surface of the base, and H2 represents a height of the base.

5. The light-emitting semiconductor substrate of claim 1, wherein the particle groups satisfy H3≤0.1×H4, wherein H3 represents a distance perpendicular to the at least one inclined surface between each of the particle groups and the at least one inclined surface of each of the protrusions, and H4 represents a distance between a top point of each of the protrusions and the upper surface.

6. The light-emitting semiconductor substrate of claim 1, wherein the particle groups satisfy D2<D1, wherein D1 represents a density of the particle groups correspondinq to the at least one inclined surface of each of the protrusions, and D2 represents a density of the particle groups correspondinq to the upper surface.

7. The light-emitting semiconductor substrate of claim 1, wherein the base further comprises:
 a central region; and
 an outer region surrounding the central region;
 wherein the particle groups and the base satisfy D4<D3, wherein D3 represents a density of the particle groups corresponding to the central region, and D4 represents a density of the particle groups correspondinq to the outer region.

8. The light-emitting semiconductor substrate of claim 1, wherein the base is a sapphire base.

9. A light-emitting semiconductor structure, comprising:
 a light-emitting semiconductor substrate, comprising:
  a base comprising an upper surface;
  a plurality of protrusions integrally formed with the base, the protrusions spaced apart from each other on the upper surface, each of the protrusions comprising at least one inclined surface; and
  a plurality of particle groups embodied inside both the base and each of the protrusions dispersedly to be a discontinuous distribution, each of the particle groups comprising Sn, Sn compounds or combinations thereof; and
 an epitaxy structure located on the light-emitting semiconductor substrate, wherein a thickness of the epitaxy structure is smaller than or equal to 10 μm.

* * * * *